US006559454B1

(12) United States Patent
Murrell et al.

(10) Patent No.: US 6,559,454 B1
(45) Date of Patent: May 6, 2003

(54) ION BEAM GENERATION APPARATUS

(75) Inventors: Adrian John Murrell, West Sussex (GB); Erik Jan Hilda Collart, West Sussex (GB); Bernard Francis Harrison, West Sussex (GB); Amir Al-Bayati, San Jose, CA (US); Chris James Burgess, East Sussex (GB); David Armour, Salford (GB); Andrew Holmes, Oxon (GB); Simon Povall, West Sussex (GB); Drew Arnold, San Jose, CA (US); Paul Anthony Burfield, West Sussex (GB)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/763,546

(22) PCT Filed: Jun. 23, 1999

(86) PCT No.: PCT/GB99/01977

§ 371 (c)(1),
(2), (4) Date: May 29, 2001

(87) PCT Pub. No.: WO01/01438

PCT Pub. Date: Jan. 4, 2001

(51) Int. Cl.[7] .................................................. H01J 37/15
(52) U.S. Cl. .................................................... 250/423 R
(58) Field of Search ......................... 250/423 R, 492.21; 315/111.81, 111.31

(56) References Cited

U.S. PATENT DOCUMENTS 4,447,773 A 5/1984 Aston
5,760,405 A * 6/1998 King et al. ............. 250/423 R
5,780,863 A 7/1998 Benveniste et al.
5,920,076 A * 7/1999 Burgin et al. .......... 250/492.21

FOREIGN PATENT DOCUMENTS

| | | |
|---|---|---|
| JP | 61114454 | 6/1986 |
| WO | WO 9704474 | 6/1997 |
| WO | WO 9923685 | 5/1999 |

OTHER PUBLICATIONS

"Development of a four–electrode extraction system for a large area ion source with a wide range of operational conditions", Shuichi Maeno, et al, Nucelar Instruments and Methods in Physics Research, Section B: Beam Interactions With Materials and Atoms, NL, North–Holland PUblishing company. Amsterdam, vol. B55, NR. 1/04, pp. 359–363.

"Beam Steering in Tetrode Extraction Systems", A.J.T. Holmes, et al., 1981 American Institute of Physics, pp. 172–179.

"Three–Stage Acceleration System for High Energy Implanter", B.O. Pedersen, et al, Nuclear Instruments and Methods in Physics Research B6 (1985) pp. 258–263.

* cited by examiner

*Primary Examiner*—Kiet T. Nguyen
(74) *Attorney, Agent, or Firm*—Boult Wade Tennant

(57) ABSTRACT

An ion beam generation apparatus comprising an ion source (20) for generating ions, and a tetrode extraction assembly (11) comprising four electrodes for extracting and accelerating ions from the ion source. The extraction assembly comprises a source electrode (22) at the potential of the ion source, an extraction electrode (23) adjacent to the source electrode to extract ions from the ion source (20), a ground electrode (25), and a suppression electrode (24) between the extraction electrode and the ground electrode. Each electrode has an aperture to allow the ion beam to pass therethrough. The gap between the extraction (23) and suppression (24) electrodes is variable in the direction of ion beam travel.

11 Claims, 5 Drawing Sheets

FIG. 4.
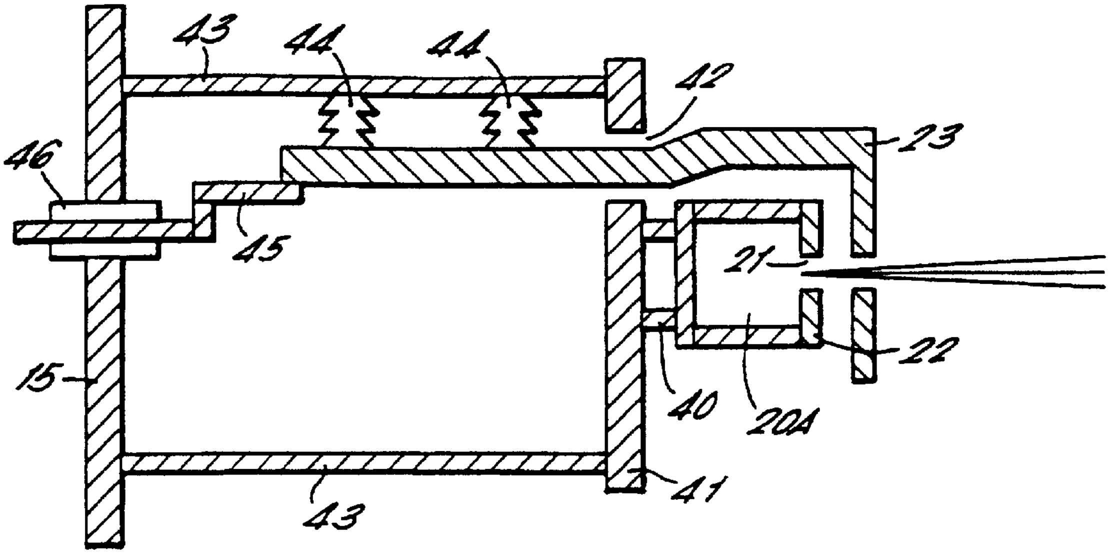
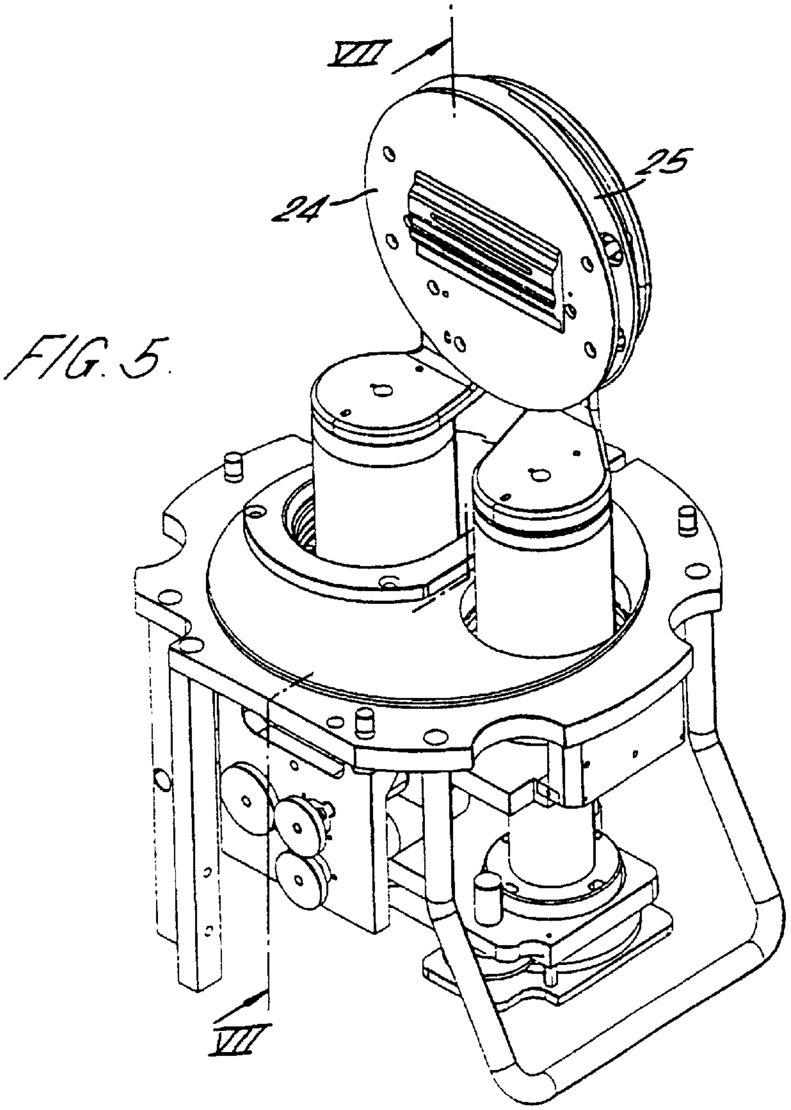
FIG. 5.

ION BEAM GENERATION APPARATUS

This application is the national phase under 35 U.S.C. § 371 of PCT International Application No. PCT/GB99/01977 which has an International filing date of Jun. 23, 1999, which designated the United States of America.

The present invention relates to an ion beam generation apparatus used, for example, in an ion implanter system for implanting ions from an ion beam target into substrates such as semi-conductor wafers.

Ion implantation techniques, e.g. for modifying the electrical conductivity properties of semi-conductor materials, are known in the manufacture of integrated circuit structures in semi-conductor wafers. Such ion implanters generally comprise an ion beam generation apparatus having a source of ions of the element to be implanted in the semi-conductor wafer, and an extraction assembly for extracting ions from the source and forming a beam of the extracted ions. The ion beam so produced is then passed through a mass analyser and selector for selecting a particular species of ions in the ion beam for onward transmission for implantation in the wafer or target substrate.

The extraction assemblies used are conventionally triode extraction assemblies, so called because they involve an arrangement of three electrodes. A triode assembly requires mechanical adjustment of the electrodes to be made in order to optimise or "tune" the ion source for maximum beam current on the target substrate. In an attempt to simplify this "tuning" operation, it has been proposed to use a tetrode assembly having four electrodes. Such an assembly is disclosed in an article entitled "Beam Steering in Tetrode Extraction Systems" (A. J. T. Holmes and E.Thompson published by the American Institute of Physics in 1981). A more recent tetrode assembly is disclosed in WO99/23685.

The tetrode assembly has four electrodes, each having at least one aperture to allow the passage of the ion beam. The first electrode is a source electrode which generally forms one wall of the ion source and is at the same potential as the ion source. The second electrode immediately adjacent to the first electrode is an extraction electrode which is set at a potential to attract ions out of the ion source. The third electrode is a suppression electrode which operates to prevent electrodes in the ion beam downstream of the ground electrode from being drawn into the ion source. The fourth electrode downstream of the suppression electrode is a ground electrode which restricts the penetration of the electric fields between the ground electrode and the ion source into the region downstream of the ground electrode.

The advantage of a tetrode structure is that the potential between the arc chamber of the ion source and the extraction electrode can be set independently of the potential between the ion source and the ground electrode. In this way, the energy of the ion beam emerging from the extraction assembly can be determined independently of the potential at which the ions are initially extracted from the arc chamber. This permits the extraction efficiency of the ion source to be optimised and simplifies the "tuning" of the ion source for maximum beam currents.

Although tetrode structures offer this potential improvement, they have not found wide acceptance in ion beam generation. To date, tuning of the tetrode assembly for a particular beam energy has been achieved by varying the voltage on each electrode. This works satisfactorily for medium energy beams. However, for high energy beams, the large potential between the extraction and suppression electrodes tends to cause breakdown between these electrodes. On the other hand, at low energies, the provision of the fourth electrode can be counter productive, as the overall length of the assembly is increased, and space charge repulsion effects cause unacceptable divergence of the beam after the extraction electrode with a consequential loss of beam current at the suppression electrode.

One approach to preventing arc discharge at higher beam energies is disclosed in the document entitled "Three-Stage Acceleration System for High Energy Implanter" (B. O. Pedersen and R. B. Liebert published in Nuclear Instruments and Methods in Physics Research B6 (1985) pages 258–263). In this approach, a further electrode, termed the acceleration electrode is positioned downstream of the extraction electrode to provide an intermediate potential level between the second electrode and the ground electrode. This results in a pentode system, namely one having five electrodes. Although this is beneficial in suppressing arc discharge, it will inevitably lengthen the extraction assembly, thereby worsening the problem of ion beam expansion due to space charge repulsion for low energy, high current beams. This arrangement is therefore equally incapable of providing an apparatus that allows maximum beam currents to be achieved over a wide energy range.

According to the present invention, there is provided an ion beam generation apparatus comprising an ion source for generating ions, and a tetrode extraction assembly comprising four electrodes for extracting and accelerating ions from the ion source, the extraction assembly comprising a source electrode at the potential of the ion source, an extraction electrode adjacent to the source electrode to extract ions from the ion source, a ground electrode, and a suppression electrode between the extraction electrode and the ground electrode, each electrode having an aperture to allow the ion beam to pass therethrough, wherein the gap between the extraction and suppression electrodes is variable in the direction of ion beam travel.

With this arrangement, the size of the gap between the extraction and suppression electrodes can be increased for high energy beams and decreased for low energy beams. Thus, the ability of the extraction and suppression electrodes to stand off the electric field without arc discharges occurring is enhanced allowing the apparatus to be used at maximum beam current to higher energy levels. On the other hand, at low beam energies, the gap between the extraction and suppression electrodes can be reduced, thereby reducing the effect of space charge repulsion.

The invention therefore provides an ion beam generation apparatus which increases the maximum beam currents that can be achieved over a wider energy range (typically 0.5–80 keV).

Further, as changing the gap between the extraction and suppression electrodes alters the focussing effect of the electric field, the invention allows better control of the beam shape over a range of beam energies.

The extraction field between the extraction and source electrodes is preferably controlled by varying the voltage alone. This allows the extraction electrode to be fixed with respect to the source electrode. This is a significant advantage of the tetrode, as it is important for the repeatability of beam tuning that the extraction and source electrodes be precisely aligned. Generally, each electrode is independently mounted to the apparatus housing through a suitable bushing which allows dimensional tolerances to build up between the source and extraction electrode making precise alignment difficult. If the extraction electrode is mounted directly to the ion source, the alignment between the two electrodes can be far more precise. The mounting of the extraction electrode on the ion source should be done through insulators which are shielded and cooled to prevent contamination of the insulator surface which can cause electrical breakdown.

The suppression and ground electrodes can be fixed with respect to one another, thereby allowing them to be mounted on a common structure. On the other hand, if greater flexibility is required, the suppression and ground electrodes may be mounted so as to be movable independently of one another.

The aperture in each electrode is generally an elongate slot. Preferably, the suppression and ground electrodes are movable relatively to the source and extraction electrodes in a lateral direction perpendicular to the beam direction and perpendicular to the lengthwise dimension of the slot. This provides additional control of the steering of the beam into the subsequent components of the apparatus.

Further, this can be used to compensate for any deflections of the beam caused by fringing magnetic fields (notably from the source magnet or analyser magnets), as well as matching the beam lateral position into the optimum region of the analyser magnet poles. This movement allows the beam strike on the electrodes to be reduced, thereby achieving higher beam currents, and also providing better control of the beam position. Preferably, the source and extraction electrodes are fixed, while the suppression and ground electrodes are laterally movable.

With the elongate slot, there is a tendency for space-charge expansion to cause the beam to blow up in the direction of elongation of the slot. This causes increased electrode strike, and hence a loss of beam current. In order to overcome this problem, at least one of the electrodes is preferably concave facing away from the ion source in the plane containing the direction of beam travel, and the direction in which the slot is elongate. Preferably, the concave electrode is the extraction electrode. This curvature focuses the beam down as it passes through the extraction electrode and into the analyser magnet. The degree of curvature is preferably such that it counteracts the space-charge expansion of the beam in this plane. The source electrode may be concave in addition to the extraction electrode.

An example of the present invention will now be described with reference to the accompanying drawings, in which:

FIG. 4 is a schematic drawing showing the mounting of the extraction electrode in greater detail than as shown in FIG. 2;

FIG. 5 is an isometric view of the mounting for the suppression and ground electrodes;

Figure 1:
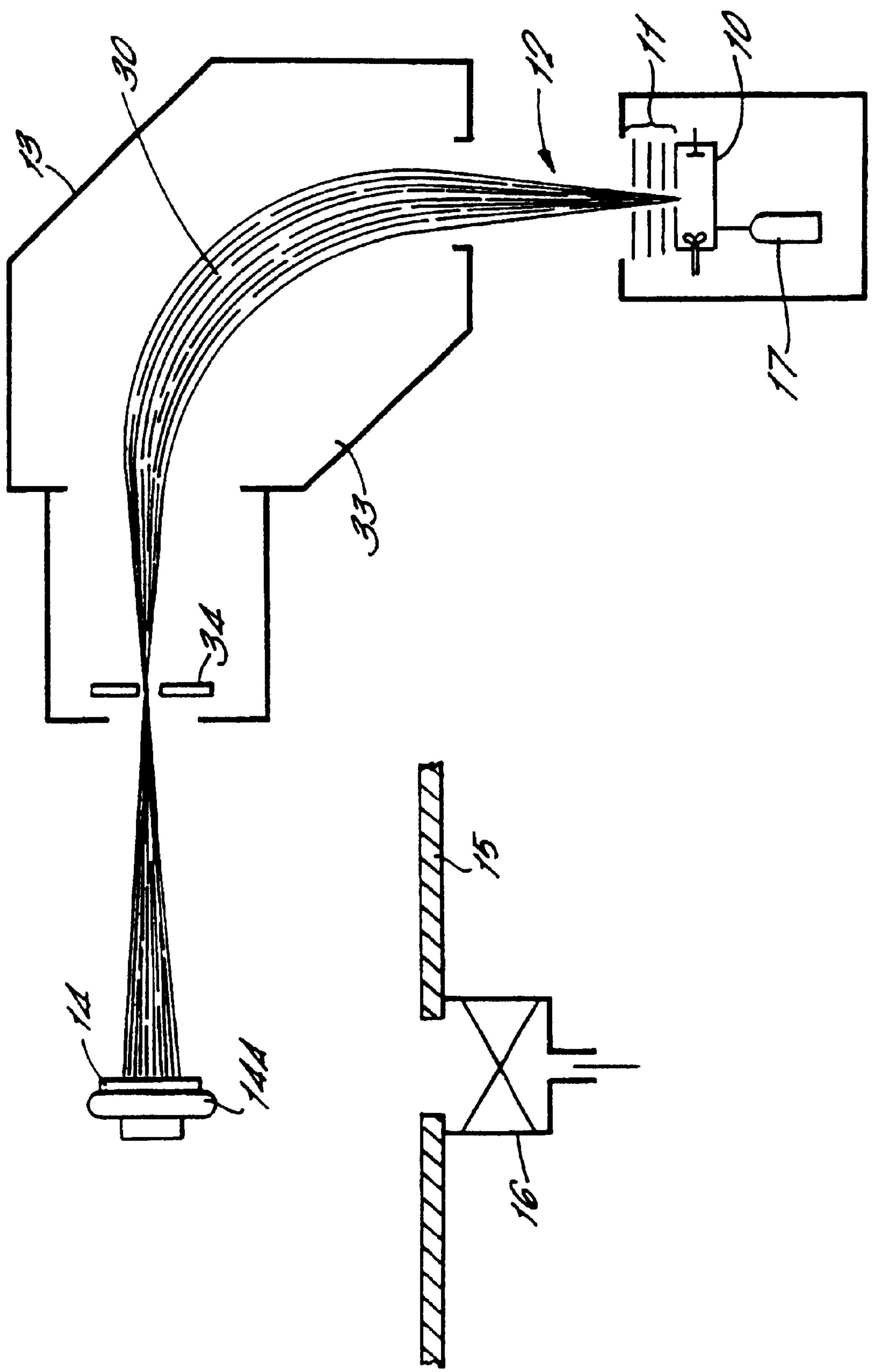
FIG. 1 is a schematic view of a ion implanter incorporating the present invention.

Referring to FIG. 1, an ion implanter apparatus comprises an ion beam source 10 with an extraction assembly 11, directing an ion beam 12 through an ion mass selector 13 to impinge on a target substrate 14 mounted on a target substrate holder 14A. As is well known to workers in this field, the above elements of the ion implanter are housed in a vacuum housing of which a part 15 only is illustrated in FIG. 1. The vacuum housing may be evacuated by a vacuum pump 16.

The ion source 10 may comprise any known ion source such as a Freeman source or a Bernas source. The ion source 10 comprises an arc chamber to which is fed a supply of atoms of or molecules containing the element, ions of which are to be implanted in the target substrate 14. The molecules may be supplied to the arc chamber in gaseous or vapour form, e.g. from a gas bottle 17.

The extraction assembly 11 comprises a number of electrodes located immediately outside a front face of the arc chamber of the ion source 10 so as to extract ions from the arc chamber through an exit aperture in the front face.

The ion mass selector 13 illustrated in FIG. 1 comprises a magnetic sector mass analyser 33 operating in conjunction with a mass selecting slit 34. The magnetic analyser 33 comprises a region of uniform magnetic field in the direction perpendicular to the plane of the paper in FIG. 1. In such a magnetic field, all ions of constant energy and having the same mass-to-charge ratio will describe circular paths of uniform radius. The radius of curvature of the path is dependent on the mass-to-charge ratio of the ions, assuming uniform energy.

As is well known for such magnetic sector analysers, the geometry of such paths tends to bring a cone of ion paths emanating from an origin focus outside the entrance aperture of the analyser 33, back to a focus beyond the exit aperture of the analysers. As illustrated in FIG. 1, the origin focus or point of origin of the central beam 30 is a point close to, typically just inside, the exit aperture of the arc chamber of the ion source 10. The beam 30 is brought to a focus in the plane of the mass selection slit 34 beyond the exit aperture of the analyser.

In FIG. 1, the beam 30 is drawn showing only ions of a single mass/charge ratio, so that the beam comes to a single focus at the aperture of the slit 34, so that the beam of ions of this mass/charge ratio can pass through the slit 34 towards the target substrate 14. In practice, the beam emitted by the ion source 10 will also contain ions of different mass/charge ratio from those desired for implantation in the substrate 14 and these undesired ions will be brought to a focus by the analyser 33 at a point in the plane of the slit 34 either side of the position of the slit, and will therefore be prevented from travelling on towards the substrate. The analyser 33 thus has a dispersion plane in the plane of the drawing.

Figure 2:
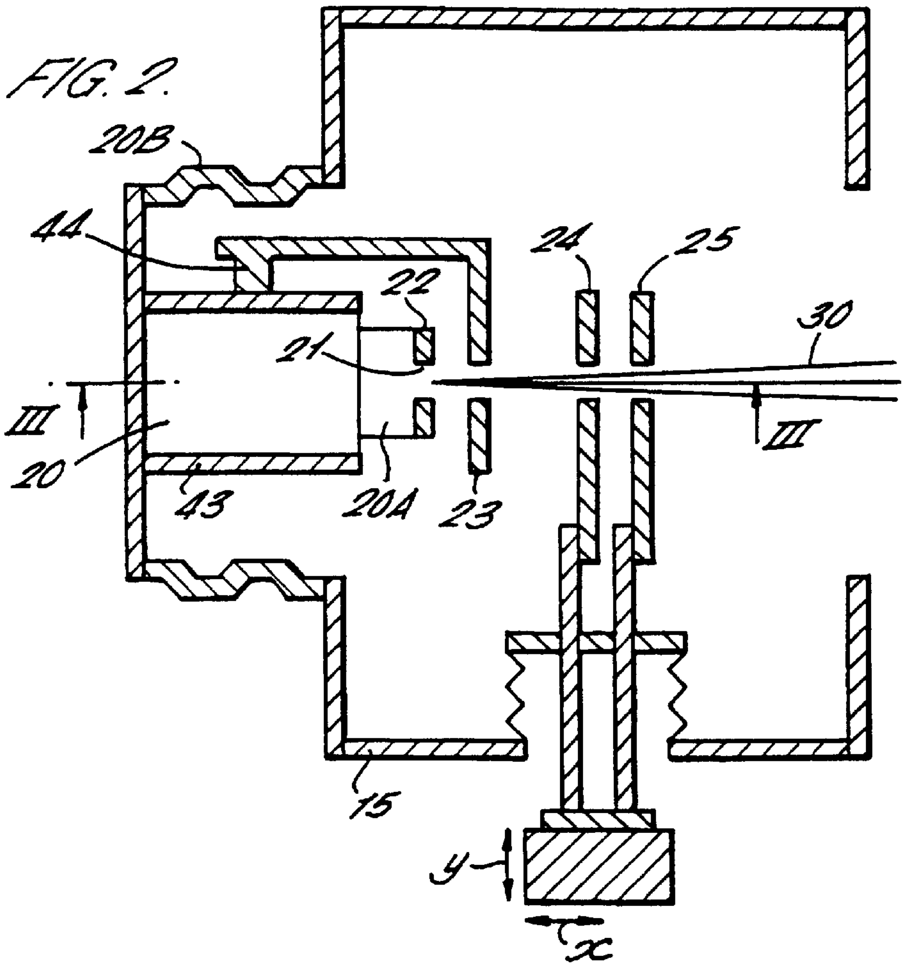
FIG. 2 is a schematic plan view illustrating the arrangement of electrodes of the present invention.
Figure 3:
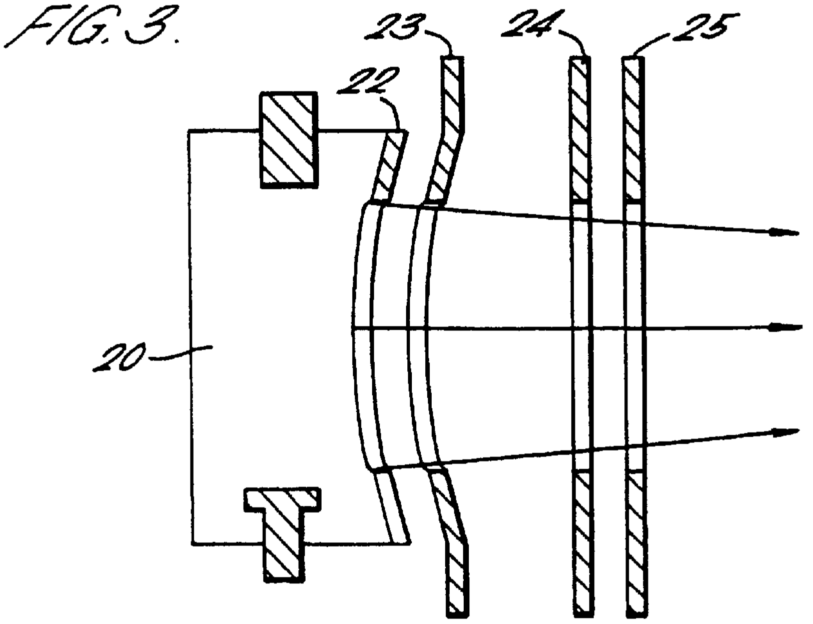
FIG. 3 is a schematic view along line III—III in FIG. 2.

Referring to FIGS. 2 and 3, the ion source and extraction assembly are illustrated schematically. The ion source 20 comprises an arc chamber 20A mounted to housing 15 by arms 43 as more fully described with reference to FIG. 2. A bushing 20B acts as an insulator to isolate the ion source 20 from the remainder of the housing 15. Ions formed in the arc chamber 20A are extracted from the source 20 through an exit aperture 21 in a front face 22 of the source. The front face 22 of the ion source 20 forms a first apertured source electrode at the potential of the ion source forming part of the extraction assembly 11 (FIG. 1). The rest of the extraction assembly 11 is illustrated in FIG. 2 by extraction, suppression and ground apertured electrodes 23, 24 and 25 respectively. Each of the apertured electrodes 23, 24 and 25 comprise a single electrically conductive plate having an aperture through the plate to allow the ion beam emerging from the ion source 20 to pass through. Each aperture has an elongate slot configuration with the direction of elongation being perpendicular to the plane in FIG. 2 and in the plane of FIG. 3.

For a beam of positive ions, the ion source 20 is maintained by a voltage supply at a positive voltage relative to ground. The ground electrode 25 restricts the penetration of the electric fields between the ground electrode 25 and the ion source 20 into the region to the right (in FIG. 2) of the electrode 25. The energy of the ion beam emerging from the extraction assembly is determined by the voltage supplied to the ion source. A typical value for this voltage is 20 kV, providing an extracted beam energy of 20 keV. However extracted beam energies of 80 keV and higher, or 0.5 keV or lower may also be contemplated. To obtain higher or lower voltages, it is a matter of raising or lowering respectively the source voltage.

The suppression electrode 24 is biased by a voltage supply to a negative potential relative to ground. The negatively biased suppression electrode 24, operates to prevent electrons in the ion beam downstream of the ground electrode 25 (to the right in FIG. 2) from being drawn into the extraction region and into the ion source. As is known to workers in this field, it is important to minimise the loss of electrons from the ion beam in zero electric field regions, so as to maintain ion beam neutralisation.

For a beam of positive ions, the extraction electrode is maintained by a voltage supply at a potential below the potential of the ion source to extract the ions from the ion source. The potential of the extraction electrode 23 would typically be below the potential of the suppression electrode 24 for a low energy beam and above the potential of the suppression electrode 24 for a high energy beam. In the former case, the beam will decelerate between the extraction and suppression electrodes, while in the latter case it will accelerate here.

The extraction electrode 23, and the source electrode 22 are curved in the plane of the paper of FIG. 3 so as to be concave facing away from the source 20. The degree of curvature is sufficient to suppress any divergence of the beam in the direction perpendicular to the plane of the paper on FIG. 2.

The mounting of the extraction electrode 23 is shown in more detail in FIG. 4. The arc chamber 20A is mounted by a pair of arms 40 to a circular disc 41 having a hole 42 through which the extraction electrode 23 penetrates. The circular disc 41 is itself supported by two arms 43 attached to the housing 15. The extraction electrode 23 is supported from one of the arms 43 by a pair of insulators 44. A lead 45 supported through the wall of the housing 15 by an insulator 46 connects the extraction electrode 23 to a voltage supply (not shown). It will be appreciated that the disc 41 provides shielding to prevent contaminants from being deposited on the electrode mounting. In order to cool the electrode and mounting, a passage for coolant is provided through one of the arms 43, around the disc 41, and back through the other arm 43.

The suppression 24 and ground 25 electrodes are mounted as shown in FIG. 2 so as to be moveable in the beam direction as represented by the arrow x and in a steering direction as represented by arrow y.

The suppression electrode 24 is mounted so as to be movable relatively to the extraction electrode in the direction of travel of the ion beam 30 as indicated by the arrow x. The apparatus can be "tuned" such that the gap between the extraction and suppression electrodes is larger, the larger the beam energy. The ground electrode 25 may be movable in the direction 26 together with or independently of the suppression electrode 24. The electrodes are further mounted, such that the suppression at 24 and ground 25 electrode are relatively movable laterally in the direction of arrow 27, namely in the plane of the paper and perpendicular to the ion beam direction 26, relatively to the extraction 23 and source 21 electrodes.

Figure 6:
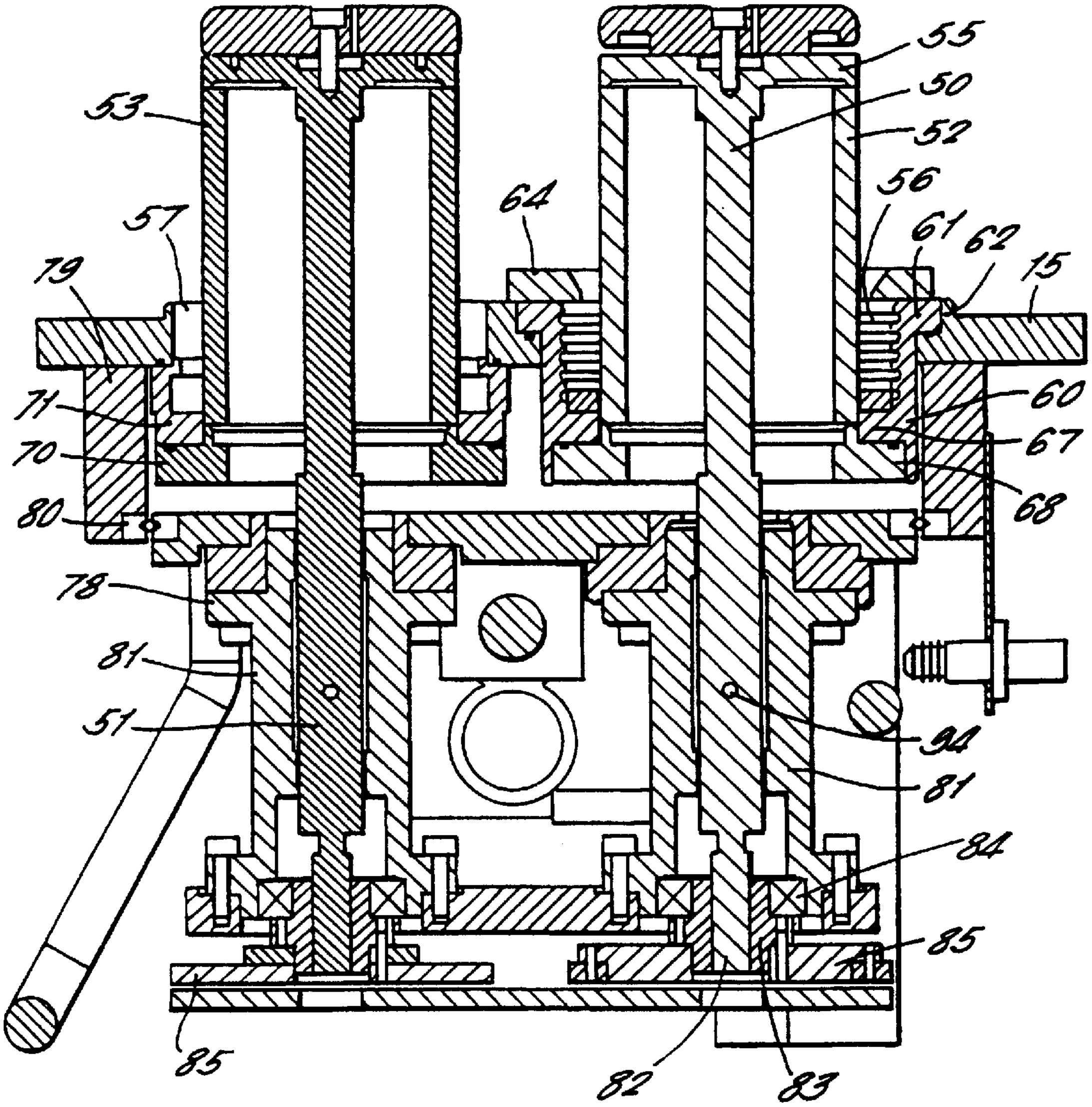
FIG. 6 is a section through the VI—VI as shown in FIG. 7.
Figure 7:
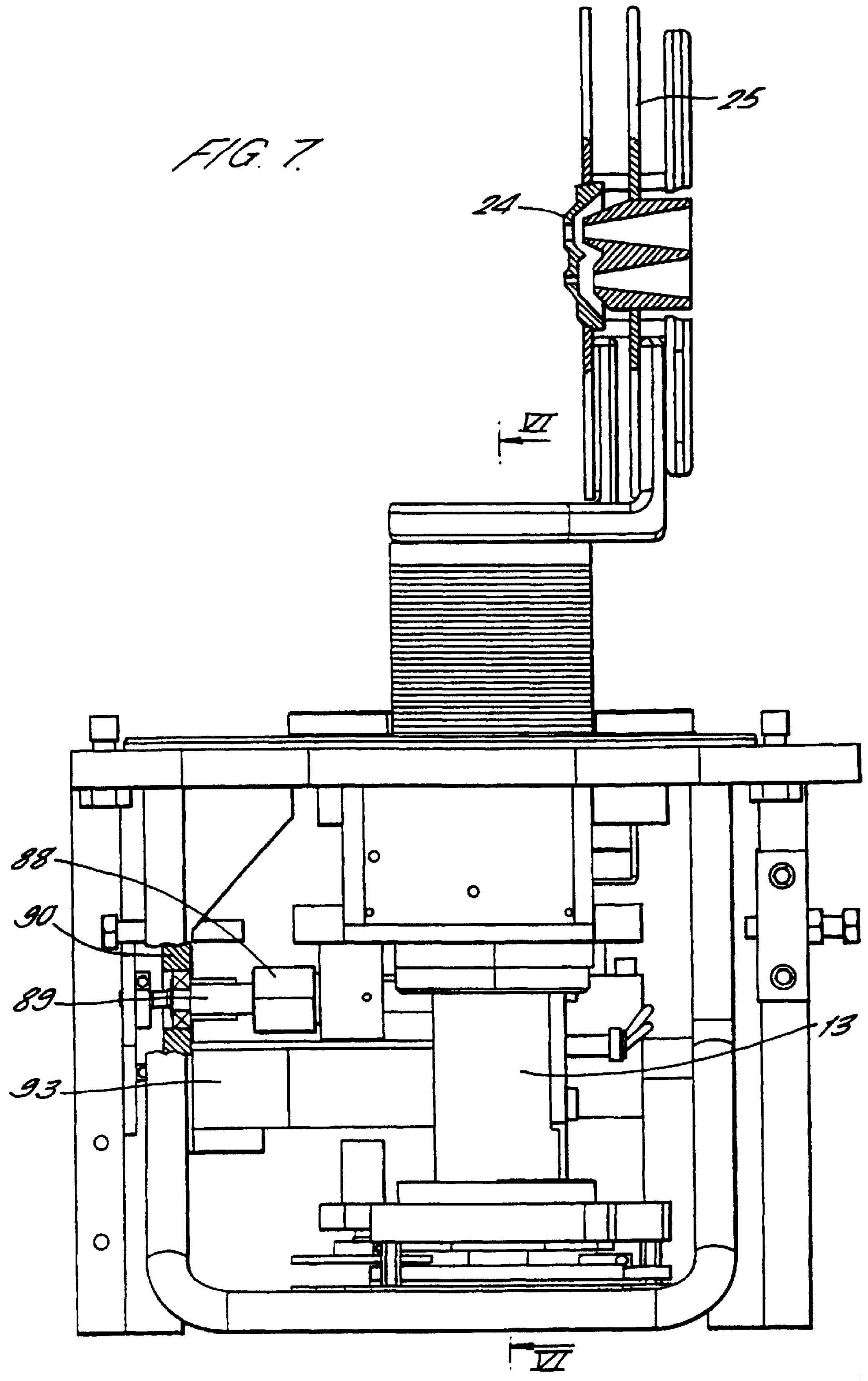
FIG. 7 is a section through the plane VII—VII as shown in FIG. 5.

The detail of the mounting of the suppression 24 and ground 25 electrodes is shown in FIGS. 5 to 7. The arrangement used is similar to that disclosed in WO97/04474.

Referring to FIGS. 5 to 7, separate actuator arms 50, 51 support the electrodes 24, 25 (not shown in FIG. 6) and are each coupled across the vacuum chamber wall by a respective flexible coupling member, for example bellows 52, 53 which allow each arm to move both transversely y and parallel x to the chamber wall section 15. The bellow 52, 53 each have a convoluted cylindrical wall one end of which is connected to a respective actuator arm 50, 51 via an end part 55.

Two apertures 56, 57 are formed in the chamber wall section 54. One of the apertures 56 has a stepped configuration, with the larger diameter bore being formed in the inward side of the chamber wall section 15. An electrically insulating member 60, having a generally cylindrical form and comprising an outwardly extending flange 61 at one end thereof, is located in the aperture 56. The outwardly extending flange 61 is seated against the shoulder 62 defined by the stepped aperture 56, and the insulating member 60 extends through the aperture 56 beyond the external face of the chamber wall section 15. A ring clamp 64 is positioned against the inner face of the wall section 15 and over at least part of the outwardly extending flange 61 and is screwed into the wall section 15 to hold the insulating member 60 in place. An 'O' ring is positioned between the opposed surfaces of the flange 61 and inner rim of the stepped aperture 56, and is held in compression by the clamping ring 64 to form a vacuum seal between the wall section 15 and the insulating member 60.

An inwardly extending flange 67 is formed near the other end of the insulating member 60 and defines an aperture through which the bellows 52 is received. An outwardly extending flange 68 is formed at the end of the bellows 52 furthest from the part 55 on which the electrodes are mounted, and this flange 68 is seated within the electrically insulating member 60 and abuts the inwardly extending flange 67. An 'O' ring is positioned between these two flanges 67, 68 to form a vacuum seal between the bellows 52 and the insulating member 60.

The other bellows 53 is received in the other aperture 57 of the chamber wall section 15, and has an outwardly extending flange 70 formed at the opposite end from the end part 55 which is connected to the actuator arm 51. The bellows 53 is mounted on the outside of the chamber wall section 15 via a spacer ring 71 which is sandwiched between the flange 70 and the rim of the aperture 57, so that both bellows 52, 53 protrude by equal amounts beyond the outer face of the wall section 15. 'O' rings are placed between the flange 70 of the bellows 53 and the spacer ring 71 and between the spacer ring 71 and the outer rim of the wall section 15 so as to form a vacuum seal between these joints.

Both bellows 52, 53 comprise an electrically conductive material, e.g. stainless steel, and are each electrically connected to a respective electrode 24, 25. This embodiment is arranged so that the ground electrode 25 is permanently maintained at ground potential with the conductive path between the electrode 25 and ground being formed by the bellows 53, the spacer ring 71 and the chamber wall section 15, all of which comprise electrically conductive materials. High voltages are applied only to the suppression electrode 24 so that only one electrically insulating member 60 is required.

In this arrangement, part of the external surface of the insulating member 60 forms part of the external surface of the chamber wall. Therefore, in use, this surface is cooled naturally by the air which surrounds and flows next to the chamber wall, and heat transferred to the insulating member 60 from the ion source gases is conducted through the insulating member from the surface within the chamber to the air outside the chamber. In this way, the surface of the insulating member within the chamber is cooled, with the result that the rate of condensation of deposits over the surface of the insulator is substantially reduced.

The positioning of the electrodes is controlled by an actuator assembly 77. This comprises a support structure 78 which is mounted on support blocks 79 secured to the chamber wall section 15. The support structure 78 is slidably mounted on the support blocks 79 via roller slides 80 so that the support structure is free to move in a direction normal to the page containing FIG. 6, i.e., so that the electrodes 24, 25 can be moved towards or away from the ion source. The support structure 78 comprises a pair of transversely spaced bearing blocks 81 which receive and support a respective actuator arm 50, 51, and which allow each arm to move transversely of the chamber wall section 15 to permit transverse movement of the electrodes 24, 25 across the exit aperture 21.

A threaded shaft 82 is formed at the end of each actuator arm 50, 51. A complementary nut 83 is screwed onto each threaded shaft and engages with a thrust bearing 84 which is seated in a recess formed in the end of each bearing block 81 so that each nut 83 is free to rotate but its axial position is fixed. A gear wheel 85 is mounted on the end of each nut and both are driven by an electric motor. Thus, by rotating the nut 83, the actuator arms 50 and 51 are driven axially along a respective bearing block 81 causing the electrodes 24, 25 to move transversely with respect to the ion source.

A further driving mechanism is provided to move the electrodes 24, 25 towards or away from the ion source independently of any transverse movement. A ball nut 88 is mounted on the actuator support structure 78 and receives a threaded ball shaft 89 which is rotatably mounted in a bracket 90 fixed to the vacuum chamber side wall section 15. The ball nut 88 is rotated by a motor 93 which propels the ball nut axially along the shaft 89, thereby causing the actuator support structure 78 and electrodes 24, 25 to move in the direction 'x' parallel to the side wall section 15 of the vacuum chamber.

In this embodiment, the separation between the electrodes 24, 25 is fixed by the fixed relationship between the actuator arm bearing blocks 81 in the actuator support structure 78. However, in another embodiment the actuator may be arranged so that the actuator arms can be moved in a direction transverse to their longitudinal axis independently of one another so that the separation between the extraction electrodes can also be varied, in addition to their distance from the ion source. In one embodiment, the inter-electrode separation may be allowed to vary by mounting the bearing block 81 associated with one of the actuator arms 50, 51 on a further roller slide or other suitable bearing, which enables the bearing block to move in the direction parallel to the vacuum chamber side wall section 15, i.e., perpendicular to the sheet containing FIG. 6.

In the embodiment shown in FIGS. 5 to 7, the driving mechanism responsible for driving the actuator arms transverse to the ion source, is arranged to drive both actuator arms together through the bearing blocks as though the actuator arms 50, 57 were rigidly joined together. However, in another embodiment, each actuator arm may be independently drive in a direction transverse to the ion source so that the position of the extraction electrodes relative to each other may be changed in a transverse direction. This arrangement would allow the alignment between the apertures formed in the extraction electrodes to be varied so enabling the exit angle of the ion beam to be controlled. This would allow, for example, the user to compensate for any offset in the beam line angle caused by the ion source magnet.

As mentioned above, the embodiment shown in FIGS. 5 to 7 is designed to allow a high voltage to be applied to one of the extraction electrodes only. Advantageously, the actuator arm 50 provides an electrically conductive path to the suppression electrode 24, which removes the need for a separate high voltage lead within the vacuum chamber. A high voltage source is mounted on the chamber wall section 15 and a suitable electrical lead from the high voltage source is connected to the actuator arm 50 through an aperture formed in the bearing block 81. The point of connection is indicated by the hole 94 formed in the actuator arm 50 shown in FIG. 6, which receives a screw for clamping the lead to the actuator arm 50.

What is claimed is:

1. An ion beam generation apparatus comprising an ion source for generating ions, and a tetrode extraction assembly comprising four electrodes for extracting and accelerating ions from the ion source, the extraction assembly comprising a source electrode at the potential of the ion source, an extraction electrode adjacent to the source electrode to extract ions from the ion source, a ground electrode, and a suppression electrode between the extraction electrode and the ground electrode, each electrode having an aperture to allow the ion beam to pass therethrough, wherein the gap between the extraction and suppression electrodes is variable in the direction of ion beam travel.

2. An apparatus according to claim 1, wherein the extraction electrode is fixed with respect to the source electrode.

3. An apparatus according to claim 2, wherein the extraction electrode is mounted directly to the ion source.

4. An apparatus according to claim 3, wherein the extraction electrode is mounted directly to the ion source through insulators which are shielded and cooled.

5. An apparatus according to claim 1, wherein the suppression and ground electrodes are fixed with respect to one another.

6. An apparatus according to claim 1, wherein the suppression and ground electrodes are mounted so as to be movable independently of one another.

7. An apparatus according to claim 1, wherein the aperture in each electrode is generally an elongate slot, and the suppression and ground electrodes are movable relatively to the source and extraction electrodes in a lateral direction perpendicular to the beam direction and perpendicular to the lengthwise dimension of the slot.

8. An apparatus according to claim 7, wherein the source and extraction electrodes are fixed, while the suppression and ground electrodes are laterally movable.

9. An apparatus according to claim 1, wherein at least one of the electrodes is concave facing away from the ion source in the plane containing the direction of beam travel and the direction in which the aperture is elongated.

10. An apparatus according to claim 9, wherein the concave electrode is the extraction electrode.

11. An apparatus according to claim 10, wherein the source electrode is also concave.

* * * * *